United States Patent
Zhang et al.

(10) Patent No.: US 12,099,569 B2
(45) Date of Patent: Sep. 24, 2024

(54) ADAPTIVE SETTLING TIME CONTROL FOR BINARY-WEIGHTED CHARGE REDISTRIBUTION CIRCUITS

(71) Applicant: Applied Materials, Inc., Santa Clara, CA (US)

(72) Inventors: Xiaofeng Zhang, San Jose, CA (US); She-Hwa Yen, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/337,955

(22) Filed: Jun. 20, 2023

(65) Prior Publication Data

US 2023/0334118 A1  Oct. 19, 2023

Related U.S. Application Data

(63) Continuation of application No. 17/092,227, filed on Nov. 7, 2020, now Pat. No. 11,681,776.

(Continued)

(51) Int. Cl.
*G06F 17/16* (2006.01)
*G06F 7/50* (2006.01)
(Continued)

(52) U.S. Cl.
CPC ............... *G06F 17/16* (2013.01); *G06F 7/50* (2013.01); *G06F 7/523* (2013.01); *H03M 1/662* (2013.01)

(58) Field of Classification Search
CPC ........ G06F 17/15; G06F 17/153; G06F 17/16; G06F 7/50; G06F 7/523; G06F 7/5443; H03M 3/498
See application file for complete search history.

(56) References Cited

U.S. PATENT DOCUMENTS 5,835,045 A  11/1998 Ogawa et al.
6,611,164 B2  8/2003 Uno
(Continued)

FOREIGN PATENT DOCUMENTS

CN  110689580 A  1/2020
KR  20180110080 A  10/2018
(Continued)

OTHER PUBLICATIONS

Genov et al., "Massively Parallel Inner-Product Array Processor", IEEE, IJCNN'01. International Joint Conference on Neural Networks. Proceedings (Cat. No. 01CH37222), vol. 1, 2001, pp. 183-188.

(Continued)

*Primary Examiner* — Emily E Larocque
(74) *Attorney, Agent, or Firm* — Kilpatrick Townsend & Stockton LLP

(57) ABSTRACT

A method and circuit for performing vector operations may include, for each sequentially performed operation, operating a switch that corresponds to a current bit-order. Operating the switch may cause a value corresponding to an output of the operation to be stored on a capacitor corresponding to the current bit-order. A time interval during which the switch is operated may be non-uniform with respect to time intervals for other switches, and the time interval may be based at least in part on a settling time of the capacitor. The method may also include performing a bit-order weighted summation of values stored on the plurality of capacitors to generate a result of the vector operation.

13 Claims, 8 Drawing Sheets

Related U.S. Application Data

(60) Provisional application No. 63/089,491, filed on Oct. 8, 2020.

(51) Int. Cl.
    *G06F 7/523*     (2006.01)
    *H03M 1/66*     (2006.01)

(56) References Cited

U.S. PATENT DOCUMENTS

| | | |
|---|---|---|
| 8,228,076 B2 | 7/2012 | Cormier, Jr. et al. |
| 8,421,658 B1 | 4/2013 | Yau et al. |
| 10,621,269 B2 * | 4/2020 | Phelps ............... G06F 17/16 |
| 11,355,167 B2 | 6/2022 | Seok et al. |
| 11,681,776 B2 | 6/2023 | Zhang et al. |
| 2004/0243657 A1 | 12/2004 | Goren et al. |
| 2015/0002321 A1 | 1/2015 | Zhou et al. |
| 2017/0228345 A1 | 8/2017 | Gupta |
| 2018/0157622 A1 | 6/2018 | Dourbal |
| 2019/0080230 A1 | 3/2019 | Hatcher |
| 2020/0081937 A1 | 3/2020 | Fick et al. |
| 2020/0242190 A1 | 7/2020 | McCollum et al. |
| 2020/0401206 A1 | 12/2020 | Kallam et al. |
| 2022/0108158 A1 | 4/2022 | Grobis et al. |
| 2022/0113941 A1 | 4/2022 | Zhang et al. |
| 2022/0113942 A1 | 4/2022 | Yen et al. |

FOREIGN PATENT DOCUMENTS

| | | |
|---|---|---|
| KR | 20200058381 A | 5/2020 |
| TW | 202029067 A | 8/2020 |

OTHER PUBLICATIONS

Lee et al., "Analysis and Design of a Passive Switched-Capacitor Matrix Multiplier for Approximate Computing", Institute of Electrical and Electronics Engineers Journal of Solid-State Circuits, vol. 52, No. 1, Sep. 29, 2016, pp. 1-34.

Application No. PCT/US2021/052508, International Preliminary Report on Patentability, Mailed on Apr. 20, 2023, 6 pages.

Application No. PCT/US2021/052508, International Search Report and Written Opinion, Mailed on Jan. 17, 2022, 9 pages.

\* cited by examiner

ADAPTIVE SETTLING TIME CONTROL FOR BINARY-WEIGHTED CHARGE REDISTRIBUTION CIRCUITS

CROSS-REFERENCES TO RELATED APPLICATIONS

This application is a continuation of U.S. Provisional application Ser. No. 17/092,227, filed Nov. 7, 2020, which claims the benefit of U.S. Provisional Application No. 63/089,491, filed Oct. 8, 2020, titled "ADAPTIVE SETTLING TIME CONTROL FOR BINARY-WEIGHTED CHARGE REDISTRIBUTION CIRCUITS," the entire contents of which, including an appendix, is incorporated herein by reference in its entirety for all purposes.

TECHNICAL FIELD

This disclosure generally relates to serial charge redistribution using binary-weighted capacitor arrays. Specifically, this disclosure relates to an adaptive timing control for switches associated with capacitors in the binary-weighted array.

BACKGROUND

A vector-matrix multiplication operation can be defined as the sum of a product of a vector and a matrix. Specifically, Equation 1 can be used to define a vector-matrix multiplication operation in which the product is summed.

$$Y = \sum_i W_{ij} X_i \qquad \text{Eq. 1}$$

In Equation 1, $X_i$ is an input vector composed of values (which can be represented in an electronic environment using binary bits) and $W_{ij}$ represents matrix weighting values. Y is the output vector obtained by summing the product vector. This function has applications in various signal processing, image processing, and artificial intelligence applications, such as in the use of neural-networks.

Performing this equation, when performed digitally, can consume a significant amount of processing resources and/or energy. Conventional analog componentry or digital and analog hybrid componentry can require a relatively large number of clock cycles, and/or a relatively large area of space to implement.

SUMMARY

In some embodiments, a method for performing vector-matrix multiplication may include converting a digital input vector comprising a plurality of binary-encoded values into a plurality of analog signals using a plurality of one-bit digital-to-analog converters (DACs). The method may also include sequentially performing, using an analog vector matrix multiplier, a vector-matrix multiplication operation using a weighting matrix for each bit-order of the plurality of analog signals. For each sequentially performed vector-matrix multiplication operation, the method may additionally include operating a switch in a plurality of switches that corresponds to a current bit-order. Operating the switch may cause a value corresponding to an output of the analog vector matrix multiplier to be stored on a capacitor in a plurality of capacitors, and the capacitor and may correspond to the current bit-order. A time interval during the switch is operated may be non-uniform with respect to time intervals during which other switches in the plurality of switches are operated. The time interval may be based at least in part on a settling time of the capacitor. The method may also include performing a bit-order weighted summation of values stored on the plurality of capacitors to generate a result of the vector-matrix multiplication.

In any embodiment, any or all of the following features may be included in any combination and without limitation. A method may additionally include operating a reset switch that clears the values stored on the plurality of capacitors after generating the result of the vector-matrix multiplication. The output of the analog vector matrix multiplier may include an analog current. For each sequentially performed vector-matrix multiplication operation, the analog current may be converted into an analog voltage through a driver circuit, and the analog voltage may be stored on the capacitor. Performing a bit-order weighted summation may include operating the plurality of switches to redistribute charge stored on the plurality of capacitors; and measuring a voltage across the plurality of capacitors, where the plurality of capacitors may be arranged in parallel. The settling time for the capacitor may be measured during operation, and the time interval based on the settling time may be dynamically adjusted after measuring. The plurality of capacitors may have capacitance values that double with each bit-order.

In some embodiments, a method for storing and aggregating sequential, bit-order results may include sequentially receiving a plurality of bit-order results from a bit-order operation; sequentially storing values corresponding to the plurality of bit-order results on a plurality of energy-storage elements during a plurality of time intervals; and controlling lengths of the plurality of time intervals such that they are non-uniform in length.

In any embodiment, any or all of the following features may be included in any combination and without limitation. The lengths of the plurality of time intervals may decrease in length from a most-significant bit (MSB) to a least-significant bit (LSB). The plurality of energy-storage elements may be paired with corresponding switches in a plurality of switches. The lengths of the plurality of time intervals may be controlled by sequentially closing switches in the plurality of switches corresponding to bit-order. The plurality of time intervals may include a reset time interval during which the values stored on the plurality of energy-storage elements are cleared. The plurality of time intervals may further include a summation time interval during which the values stored on the plurality of energy-storage elements are redistributed. The plurality of time intervals may further include storage time intervals during which the values corresponding to the plurality of bit-order results are stored on the plurality of energy-storage elements. The storage time intervals may have uniform lengths that are shorter than the summation time interval or the reset time interval. The plurality of time intervals may further include storage time intervals during which the values corresponding to the plurality of bit-order results may be stored on the plurality of energy-storage elements. The storage time intervals may have non-uniform lengths that are different from the summation time interval and the reset time interval.

In some embodiments, a sequential bit-order summation circuit may include an input for receiving a plurality of bit-order results from a bit-order operation; a plurality of capacitors that store values corresponding to the bit-order results received through the input; a plurality of switches that control which of the plurality of capacitors store the values corresponding to the bit-order results during a plurality of time intervals; and a controller that controls lengths of the plurality of time intervals such that they are non-uniform in length.

In any embodiment, any or all of the following features may be included in any combination and without limitation. The controller may include a processor and/or a state machine. The plurality of capacitors may be paired with the plurality of switches. The plurality of time intervals may be controlled based on settling times for the plurality of capacitors.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
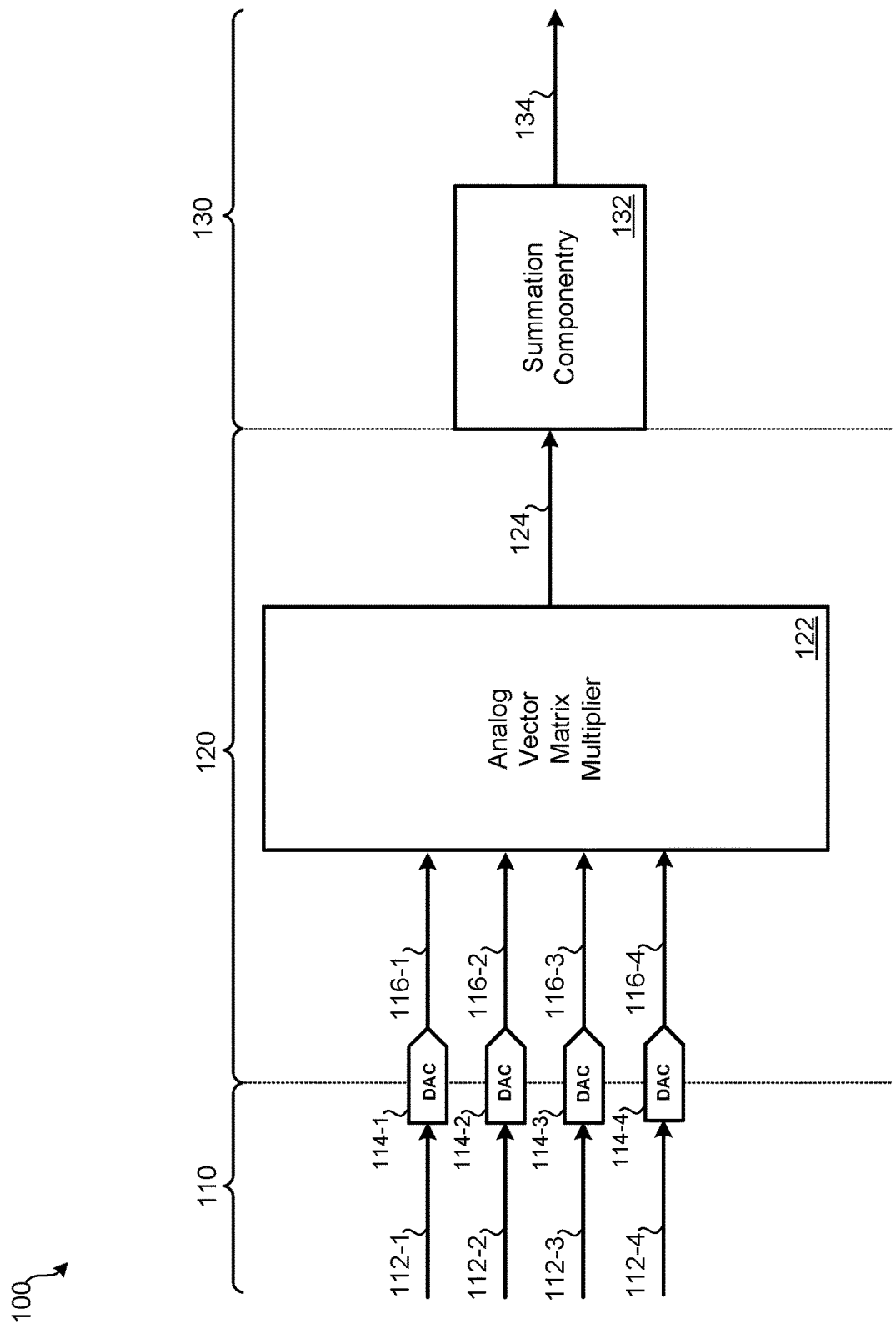
FIG. 1 illustrates an embodiment of a vector-matrix multiplier circuit in which vector multiplication is performed using analog components to bit-ordered binary values.

A summation circuit for bit-order operations, such as bit-order multiplier-accumulator (MAC) operations may include a switch capacitor network. Each parallel path in the switch capacitor network may include a switch with a corresponding capacitor. The capacitors may sequentially double in size corresponding the ascending binary bit-orders. As each bit-order result is generated, a value may be stored on a corresponding capacitor. At the end of the bit-order operations, charge may be redistributed across the capacitors to generate a final analog voltage representing the result of the operation. Time intervals for each bit-order operation may be uniform in length. Specifically, the switching time for each capacitor in the network may be the same. However, this may lead to an unnecessarily long total cycle time, as the settling time for smaller capacitors may be significantly smaller than for larger capacitors.

These embodiments describe an adaptive timing control for serial charge redistribution in binary-weighted capacitor arrays. Adaptive timing control may improve the speed of the overall charge redistribution process by adaptively changing the timing control for each capacitor switch based on the settling time for the individual capacitors. This increases the speed with which the circuit can operate without affecting the accuracy of the result. Non-uniform cycle times may be dynamically controlled based on measured settling times for the capacitors, and different modes of operation allow for trade-offs between speed and accuracy in generating a result. The accumulation cycle times may be shorter than a reset and/or summation cycle time, which may further reduce the total time for the operation.

Embodiments detailed herein allow for MAC operations to be performed during a shorter amount of time (e.g., fewer clock cycles) compared to conventional analog embodiments and do not require digital input signals to be decoded. Rather, input vectors in the form of binary encoded (or "bit-ordered") values can be received. Such values are typically arranged from least-significant bit (LSB) to most-significant bit (MSB), or MSB to LSB (e.g., "1110", representing a value of 14). These values can be multiplied in the analog domain then summed in the analog or digital domain. Arrangements detailed herein are performed directly on analog conversions of binary encoded values and do not require the input vectors to be converted to a series of pulses (e.g., fourteen pulses to represent a value of 14). Thus, computation can be performed significantly quicker than conventional analog arrangements. More specifically, the number of operation cycles to perform vector-matrix multiplication can be reduced by $$\frac{2^{Nbit}}{Nbit + 2}$$

times. In this equation, the additional 2 cycles indicated in the denominator can vary by implementation. For example, embodiments detailed herein can perform vector-matrix multiplication for 8-bit input vectors that may be sped up 25.6 times as compared to conventional analog MAC designs.

Further, the arrangements detailed herein may have significant space savings over conventional analog MAC designs. By using one bit digital-to-analog converters (DACs), less area may be needed than if multi-bit DACs that convert a binary value received in parallel are used. Specifically, multiple one bit DACs may be used to convert binary-encoded input vectors to binary-encoded analog voltage values in parallel. For instance, for four bit input vectors, four clock cycles may be needed to output the binary-encoded analog voltage value from the one-bit DAC (one cycle for LSB, one cycle for second LSB, one cycle for second MSB, one cycle for MSB). The number of one-bit DACs may be dependent on the number of input vectors ($X_i$ in Equation 1).

Matrix multiplication operations may be performed sequentially for each bit-order of the input vector's values at a time. The parallel output of each one-bit DAC may be input to weighting components of a vector matrix multiplier circuit. The vector matrix multiplier circuit may have various weighting components that correspond to the $W_{ij}$ matrix of Equation 1 with which $X_i$ is being multiplied. The vector matrix multiplier circuit may perform multiplication operations for each bit-order of the input vectors. Therefore, if the input vector contains values four bits in length, the vector matrix multiplier circuit may perform multiplication operations for each of the four bit-orders sequentially in the time domain. The output from the vector matrix multiplier circuit may be sequential signals (e.g., that have a current or some of electrical characteristic indicative of a multiplication result) that are output to a summation circuit.

The summation circuit may function to perform a bit-order weighted summation after the matrix multiplication operations have been performed. The summation circuit may function in either the analog or digital domain. The summation circuit may receive signals from the vector matrix multiplication circuit, store indications of each matrix multiplication operation in such a way that it is weighted for the proper bit-order, and perform a summation to determine the output value Y.

FIG. 1 illustrates an embodiment of a circuit 100 in which vector multiplication is performed using analog components on binary-encoded inputs. Circuit 100 can include: one-bit DACs 114; analog vector matrix multiplier 122; and summation componentry 132. Circuit 100 can be understood as divided into three sections. Section 110 receives binary-encoded digital signals (which represent an input vector) and converts the binary-encoded digital signals to binary-encoded analog signals. Section 120 receives binary-encoded analog signals and outputs binary-encoded products indicative of multiplication between the binary-encoded analog signals and a pre-defined matrix (e.g., a weighting matrix). Section 130 performs a bit-order weighted summation to sum the binary-encoded products and take into account the bit-order weighting of the binary-encoded signals. Therefore, the proper bit-orders of each bit of the binary-encoded input signals is maintained such that the summation can be determined properly. Section 130 may use analog componentry to efficiently sum the product outputs of section 120. Section 130 may also function in the digital domain.

Specifically, in section 110, multiple digital input signals 112 may be received in parallel. Digital input signals 112 represent binary-encoded values and each digital input signal of digital input signals 112 can represent a value of the vector $X_i$ of Equation 1. The binary bits of input signals 112 may be represented by voltage levels (e.g., high for one, low for zero), pulses (e.g., a pulse for one, no pulse for zero) or time (e.g., a pulse of a first duration for one, a pulse of a second duration for zero). As illustrated, four digital input signals (112-1, 112-2, 112-3, and 112-4) may be received in parallel. Each of these input signals may receive a separate value of the input vector. In other embodiments, fewer or greater numbers of digital input signals may be received than specifically illustrated in FIG. 1. Each of digital input signals 112 may be binary-encoded. Therefore, for each clock-cycle of the digital portion of the circuit, a bit for a particular bit-order may be received as digital input signals 112. For example, if four-bit binary values are being input via each digital input signal 112, four clock cycles may be used for each bit of the binary values to be received and converted to the analog domain in parallel. The digital input signals 112 may be binary-encoded such that each value's bit-order is from least significant bit (LSB) to most significant bit (MSB), from MSB to LSB, or in an arbitrary, pre-defined pattern.

Digital input signals 112 may be input to one-bit DACs 114. Again here, as illustrated, four one-bit DACs 114 (114-1, 114-2, 114-3, and 114-4) are present. In other embodiments, fewer or greater numbers of one-bit DACs 114 may be present. A single one-bit DAC may be present for each binary-encoded digital input signal 112. Each of the one-bit DACs 114 may output an analog signal indicative of the digital value received. Therefore, binary-encoded analog signals 116 (116-1, 116-2, 116-3, 116-4) can represent analog translations of the digital input signals 112.

In section 120, analog vector matrix multiplier 122 may receive binary-encoded analog signals 116. Analog vector matrix multiplier 122 may sequentially perform multiplication operations on each bit-order of the input values (e.g., a first clock cycle for the LSBs, a second clock cycle for the second LSBs, a third clock cycle for the second MSB, etc.). Therefore, a separate multiplication operation may be performed for each bit-order of the received binary-encoded analog signals 116. Further details regarding possible embodiments of analog vector matrix multiplier 122 are provided below in relation to FIG. 2. Binary-encoded multiplication results signal 124 may be output to summation componentry 132.

Summation componentry 132 may be understood as performing bit-order weighted summation functionality. Summation componentry 132 may properly take into account the bit-order of the bits currently being evaluated by analog vector matrix multiplier 122, store the outputs such that the bit-order is taken into account, and perform a summation function. As detailed herein, bit-order weighting may be performed by summation componentry 132, thus allowing the input values to remain binary-encoded when evaluated by the vector matrix multiplication circuit.

In a possible analog embodiment of summation circuitry, charge accumulation and redistribution can be used to perform a passive bit-order weighted summation. As binary-encoded signals are received from analog vector matrix multiplier 122, summation componentry 132 may use charge accumulation to accumulate partial summations. Once all bit-orders (e.g., four bit-orders for an input vector having four bit values) have been multiplied by analog vector matrix multiplier 122, and summation componentry 132 has stored partial summations such as using charge accumulation, the charge may be redistributed and a voltage representative of a final summation value may be output. Further detail regarding a possible embodiment of an analog implementation of summation componentry 132 is presented below in FIG. 3.

Figure 2:
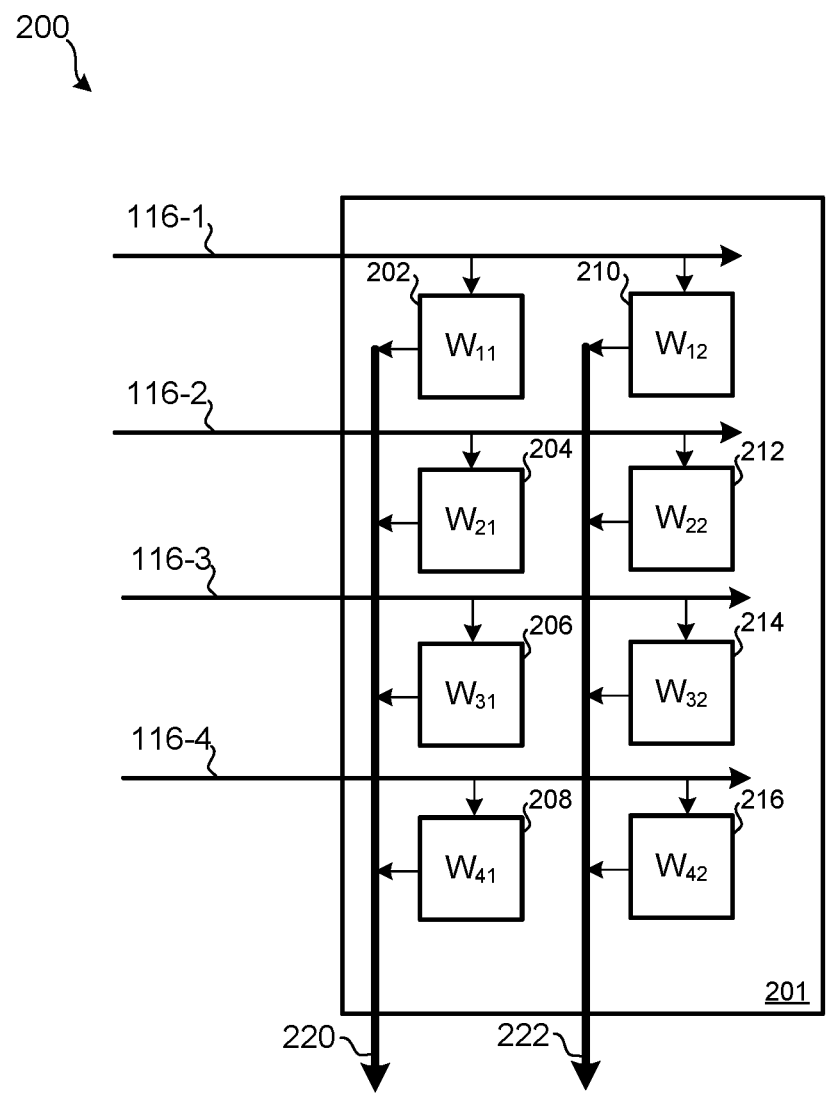
FIG. 2 illustrates an embodiment of an analog vector matrix multiplier.

FIG. 2 illustrates an embodiment 200 of an analog vector matrix multiplier that evaluates a single bit-order of an input vector that has been converted to analog. Analog vector matrix multiplier 201 may represent an embodiment of analog vector matrix multiplier 122 of FIG. 1. However, it should be understood that embodiment 200 is only an example. In FIG. 2, the binary vector input $X_i$ is to be multiplied with $W_{ij}$. Analog vector matrix multiplier 201 may include multiple weighting elements (202, 204, 206, 208, 210, 212, 214, and 216). Each weighting element may receive a binary-encoded analog signal of binary-encoded analog signals 116 from a one-bit DAC. In this example, the weighting element may output a current based on the voltage of its received binary-encoded analog signal and a weighting value of the particular weighting element. For instance, each weighting element may be implemented using various conductances. By varying the conductances of the weighting components, the amount of current output depending on the input voltage can be varied. For instance, if the voltage is 1 V, and the conductance of a weighting block is 8 μS, an output of 8 μA may be obtained. This value may further be weighted based on the bit-order of the value. Therefore, for the least significant bit, the multiplier would be 1, for the second LSB, the multiplier would be 2, and so on. In some embodiments, the weightings used by each weighting element may be predetermined and fixed at manufacture. In other embodiments, the weighting of each weighting element may be configurable after manufacture and reconfigurable during use of embodiment 200.

The output of each weighting element (202, 204, 206, 208, 210, 212, 214, and 216) can be an electrical characteristic, such as current. The currents output from the weighting elements connected to a same current output may be summed together. Therefore, current output 220 may include the sums of the current output by weighting elements 202, 204, 206, and 208; and current output 222 may include the sums of the current output by weighting elements 210, 212, 214, and 216.

A single bit of each value of the input vector is evaluated at a time (and bit-order is not taken into account by analog vector matrix multiplier 201). For example, for an input vector having four four-bit values, the MSB of each value may be evaluated first, followed by the second MSB of each value, followed by the second LSB, and finally followed by the LSB of each value (thus corresponding to four clock cycles of binary-encoded data output by the one-bit DACs). In other embodiments, evaluation may proceed from LSB to MSB or in any other predefined, arbitrary order. As detailed later in this document, the output of analog vector matrix multiplier 201 may be weighted by the summation circuitry to take into account the bit-order of the bits to which the multiplication operation is being performed by the vector matrix multiplier.

The number of columns of weighting elements is arbitrary and can be based on the weighting matrix with which the input vector is being multiplied. Therefore, while two columns are present in embodiment 200, fewer or a greater number of columns may be present in other elements. The number of rows of weighting elements may correspond to the number of values present in the input vector. For example, equation 2 can represent the current output by analog vector matrix multiplier 201:

$$I_{out_i} = \sum_{j=1}^{4} v_j * w_{ji}, i = 1 \ldots n \qquad \text{Eq. 2}$$

Continuing with the example, current outputs (e.g., current outputs 220, 222) may be connected together to create a binary-encoded multiplication result signal 124. Summation componentry 132 properly weights, stores, then sums each bit-order to obtain a correct final summation.

Figure 3:
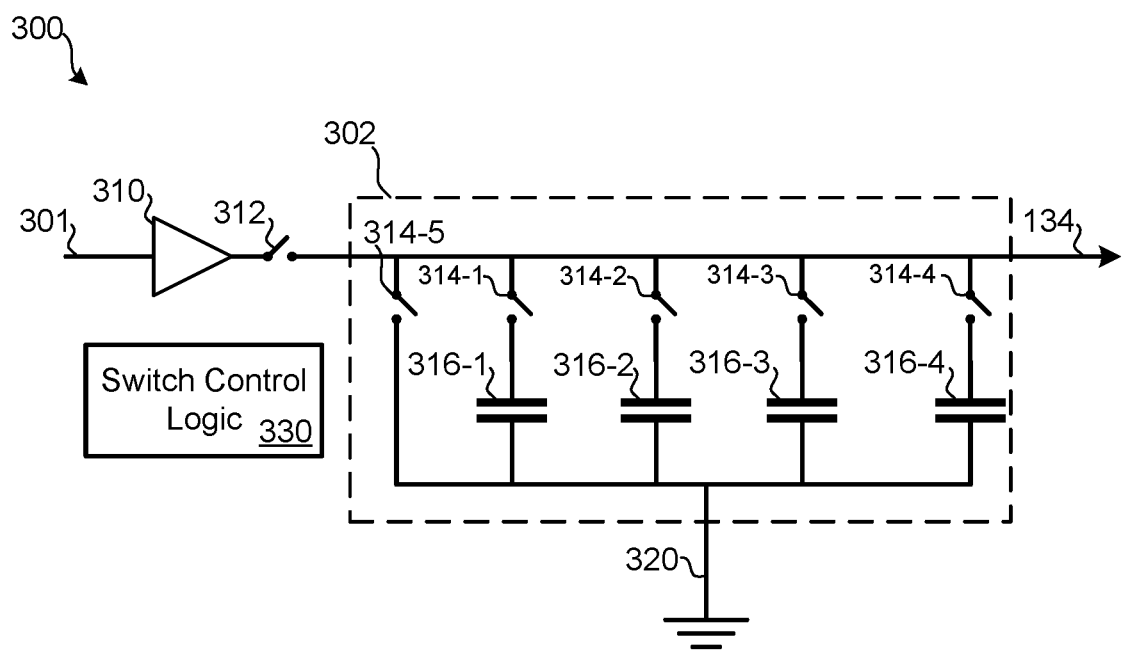
FIG. 3 illustrates an embodiment of an analog summation circuit.

FIG. 3 illustrates an embodiment 300 of an analog summation circuit. It should be understood that various different types of circuits may be used to accumulate and redistribute signals that may be in the form of voltage, current, charge or some other electrical characteristic. A key aspect of the analog summation circuit is that it applied the proper bit-weighting to received outputs of the analog vector matrix multiplier 201. For example, when an output corresponding to the second LSB of the input vector is output by the analog vector matrix multiplier 201, analog summation circuit applies a bit-weighting that is double that of the LSB and half of the third LSB. Embodiment 300 can represent summation componentry 132 of FIG. 1. Input 301 represents the binary-encoded multiplication result signal 124 from the analog vector matrix multiplier. Input 301 feeds to sense amplifier 310. Sense amplifier 310 outputs a voltage based on the current received on input 301 by sense amplifier 310. Specifically, embodiment 300 can use passive charge sharing and redistribution. Such an arrangement can help decrease power consumption and decrease the effect of thermal noise on the output value.

Embodiment 300 comprises a capacitor-switch array 302. The capacitors can be bit-order weighted, meaning that each capacitor's capacitance may be selected to passively store an amount of charge that is weighted for a particular bit-order. As an example, to output a four-bit value, four capacitors are present. Capacitor 316-1 may be used to store charge corresponding to the LSB. Therefore, capacitor 316-1 can have a capacitance of C (where C is the unit value). Capacitor 316-2 may be used to store charge corresponding to the second LSB. Therefore, capacitor 316-2 can have a capacitance of 2C (which represents double the weight as C, thus corresponding to the second LSB in a binary bit-order). Capacitor 316-3 may be used to store charge corresponding to the second MSB. Therefore, capacitor 316-3 can have a capacitance of 4C. Capacitor 316-4 may be used to store charge corresponding to the MSB. Therefore, capacitor 316-4 can have a capacitance of 8C. Each capacitor has a capacitance corresponding to the bit-order for which it will be used to store charge indicative of the output of the analog vector matrix multiplier. The capacitance can be calculated according to Equation 3, where C is the unit value and N is the number of bits in the values of the input vector.

$$\text{Capacitance} = 2^{N-1}C \qquad \text{Eq. 3}$$

Switch control logic 330, which can be digital and connected with the same clock as section 110, can control whether switches 312, 314-1, 314-2, 314-3, 314-4, and 314-5 are open or closed. For simplicity, in FIG. 3, communication between switch control logic 330 and switches 312 and 314 are not illustrated. Switch control logic 330 may be dedicated logic circuitry or may be incorporated as part of a processing system. Switch control logic 330 may initially close switches 314-1, 314-2, 314-3, 314-4, and 314-5, while switch 312 is open. Switch 314-5 may function as a reset, causing charge present in capacitors 316-1, 316-2, 316-3, and 316-4 to discharge to ground 320.

Switch control logic 330 may then control the switches such that the capacitor having the capacitance associated with the current bit-order being evaluated by analog vector matrix multiplier 122 is connected to binary-encoded multiplication result signal 124. Switch control logic 330 may close switch 312 and open switches 314-2, 314-3, 314-4, and 314-5. Therefore, only switch 314-1 may remain closed, thus connecting capacitor 316-1 to an output of sense amplifier 310. During this clock cycle, analog vector matrix multiplier 122 may be outputting a binary-encoded multiplication results signal corresponding to the LSB. For the next clock cycle, switch control logic 330 may keep switch 312 closed, open switch 314-1, and close switch 314-2. During this clock cycle, analog vector matrix multiplier 122 may output a binary-encoded multiplication results signal corresponding to the second LSB. By virtue of capacitor 316-2 having double the capacitance of capacitor 316-1, the proper bit weighting is passively applied in the amount of charge stored. For the next clock cycle, switch control logic 330 may keep switch 312 closed, open switch 314-2, and close switch 314-3. During this clock cycle, analog vector matrix multiplier 122 may output a binary-encoded multiplication results signal corresponding to the second MSB. By virtue of capacitor 316-3 having double the capacitance of capacitor 316-2, the proper bit weighting is passively applied in the amount of charge stored. For the next clock cycle, switch control logic 330 may keep switch 312 closed, open switch 314-3, and close switch 314-4. During this clock cycle, analog vector matrix multiplier 122 may output a binary-encoded multiplication results signal corresponding to the MSB. By virtue of capacitor 316-4 having double the capacitance of capacitor 316-3, the proper bit weighting is passively applied by the amount of charge stored. At this stage, switched capacitor-switch array 302 stores the binary-encoded multiplication results separately as charge in the bit-order weighted capacitors.

At this point, each of capacitors 316-1, 216-2, 316-3, and 316-4 stores an amount of charge (Q) corresponding to the capacitors' particular bit-order. The amount of charge stored on a particular capacitor, for a given bit-order N, can be defined by Equation 4.

$$Q = 2^{N-1} * C * V \qquad \text{Eq. 4}$$

Therefore, the amount of charge is equal to a capacitor's capacitance multiplied by the voltage output by sense amplifier 310. As detailed in relation to Equation 3, the capacitance is increased by a factor of $2^{N-1}$ for each greater bit-order.

During a next clock cycle, switch control logic 330 may open switch 312, keep switch 314-5 open, and close switches 314-1, 314-2, 314-3, and 314-4. This step may be understood as a charge redistribution step. Since each capacitor stores an amount of charge corresponding to its bit-order, during the charge redistribution stage, the charge in each individual capacitor is distributed among capacitors 316-1, 316-2, 316-2, and 316-3 and is indicative of the final summation. Once redistribution has occurred, the summation is represented as a voltage value at the top plates of capacitors 316, which is output via summation output 134. Equation 5 represents the voltage value that will be output via summation output 134 based on the charge stored in each capacitor.

$$V_{Out} = \frac{Q_1 + Q_2 + Q_3 + \ldots Q_N}{(2^N - 1) * C} \qquad \text{Eq. 5}$$

In Equation 5, the charge of each capacitor contributes an appropriate weighted amount based on the capacitor's associated bit-order to Void as summation output 134, which represents the final weighted sum of the analog vector-matrix multiplication.

In total, for when the input vector includes four-bit values, the summation process may take six clock cycles until a valid summation output 134 is output. Stated more generally, the summation process can require a reset clock cycle, a redistribution clock cycle, and a clock cycle for each bit of the value.

While FIG. 3 illustrates four capacitors, it should be understood that this embodiment is for example purposes only. The number of capacitors may be increased or decreased to accommodate a different number of bits for values of the input vector. In an alternate embodiment, differential summation circuitry may be implemented such that common mode interference can be canceled out from summation output 134. Further, other embodiments may use alternate passive analog components to store and sum charge to determine summation output 134. In still other embodiments, summation circuitry may be implemented using digital circuitry.

Figure 4:
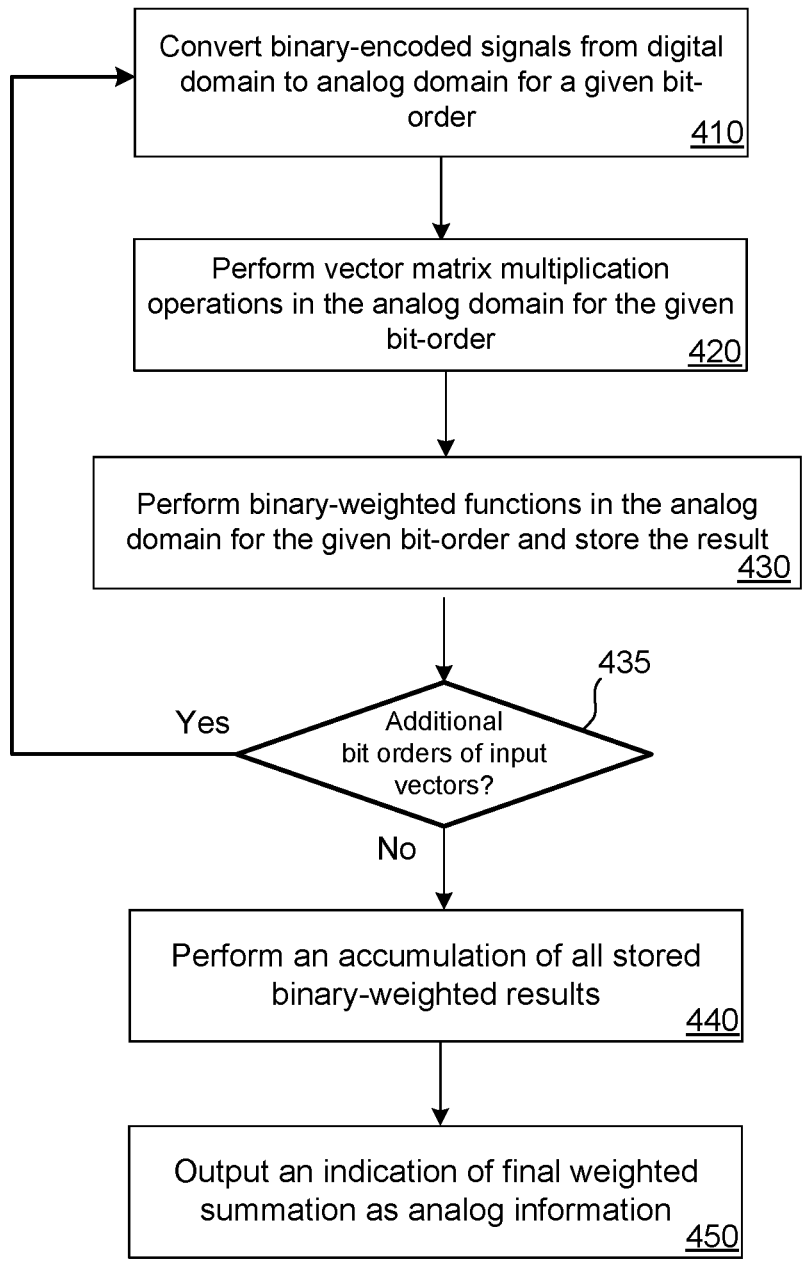
FIG. 4 illustrates an embodiment of a method for performing a vector-matrix multiplication operation.

Various methods may be performed using the systems and circuits detailed in FIGS. 1-3. FIG. 4 illustrates an embodiment of a method 400 for performing a vector-matrix multiplication operation. Method 400 may be performed using the circuits of FIGS. 1-3 or with alternate versions of such circuits. That is, it should be understood that the specific examples of circuits, such as those in FIGS. 2 and 3, are examples of how the circuit of FIG. 1 and the method of FIG. 4 can be implemented. In some embodiments, a digital summation circuit may be used.

At block 410, a bit-order of binary-encoded signals may be converted to binary-encoded analog signals. To perform this function, multiple one-bit DACs may be used in parallel. Therefore, each DAC may convert a digital signal to an analog signal for a given bit-order in parallel. Each DAC may receive a binary-encoded digital signal that is indicative of a particular bit-order for an input vector. Each vector may have N bits. Therefore, for the one-bit DACs to convert the binary-encoded digital signals to analog signals may take N clock cycles. For example, if the binary-encoded digital signal is "10011," it may take five clock cycles for this binary-encoded value (which represents a value of 19 assuming the right-most digit is the LSB) to be output by a one-bit DAC. The analog voltage output by each one-bit DAC may be dependent on a power voltage provided to each one-bit DAC.

At block 420, vector matrix multiplication is performed sequentially for the bit-order of the received binary-encoded analog signals. Block 420 may be performed for the particular bit-order of the input vectors received from the one-bit DACs. That is, block 420 may first be performed for each LSB of the values of the input vector (then, during a next iteration of block 420, the second LSB may be evaluated). Typically, the first bit evaluated would be either the MSB or LSB of the values of the input vector. Vector matrix multiplication may be performed by a circuit similar to embodiment 200 of FIG. 2. It should be understood that other embodiments of analog multiplication circuits are possible. The vector matrix multiplication multiplier may include weighting components that each cause a weighted amount of current indicative of the product of the analog input value and the weighting. Such currents, or some other electrical characteristic, may be output to summation circuitry.

At block 430, for the given bit-order for which vector matrix multiplier performed multiplication functions at block 420, the output of the vector matrix multiplier (which may be in the form of current or voltage) may be stored with a proper bit-order weighting. An indication of the received signal is weighted according to the bit-order of the bits evaluated by the analog vector matrix multiplier and stored. For instance, if evaluation by the analog vector matrix multiplier is performed from LSB to MSB, each subsequent bit may be afforded double the weight when stored by the summation circuit as compared to the previous bit. By way of example only, a sense amplifier may translate the received current from the analog vector matrix multiplier into a voltage. In some examples of a summation circuit, the voltage may be used to charge a particular capacitor having a capacitance corresponding to the bit-order for which block 420 was performed. Therefore, for example, when the LSB is evaluated, the output of the analog matrix multiplier may be used to charge a capacitor having a capacitance of C; when the second LSB is evaluated, the output of the analog matrix multiplier may be used to charge a capacitor having a capacitance of 2C, and so on.

At block 435, if additional bit-orders are yet to be evaluated, method 400 may return to block 410 and be performed for the next bit-order of the input vector. Therefore, each bit-order is evaluated by the analog vector matrix multiplier sequentially and a corresponding output is sequentially stored by the summation circuit with weighting corresponding to its bit-order. If the multiplication operation has been performed on all bit-orders at block 420 and stored at block 430, method 400 can proceed to block 440. Therefore, if each value of an input vector has four bits, blocks 420 and 430 are performed four times: once for each bit of the values.

At block 440, the summation may be determined, such as by performing an accumulation. In some embodiments, the summation is determined in the analog domain. The various bit-order weighted values stored at block 430 may be summed together. By way of example only, if a switch-capacitor array is used, the charge of capacitors may be redistributed among the capacitors, which serves to accumulate the total charge and is bit-weighted by virtue of the capacitance of each capacitor corresponding to a particular bit-order. To do this, a switch may be opened to isolate the switch-capacitor array and all switches directly connected to the capacitors (e.g., 314-1, 314-2, 314-3, and 314-4 of FIG. 3) may be closed. The charge of each capacitor can redistribute among the field of capacitors. The total amount of charge, however, will remain constant and will be properly bit-order weighted due to the difference in capacitance among the capacitors. In other embodiments, rather than using a capacitor array, another form of analog or digital circuit may be used to determine a final summation using the proper bit-orders of each multiplication result.

At block 450, an indication of the summation is output. In some embodiments, the indication of the summation is output as an analog electrical characteristic, such as a voltage magnitude. For example, a voltage at the top plate of a capacitor array as in FIG. 3 can represent the summation of the vector-matrix multiplication. This voltage can be measured and possibly used to determine a numerical value. For example, a separate circuit may use this output voltage, such as an ADC to convert the voltage back to the digital domain.

Figure 5:
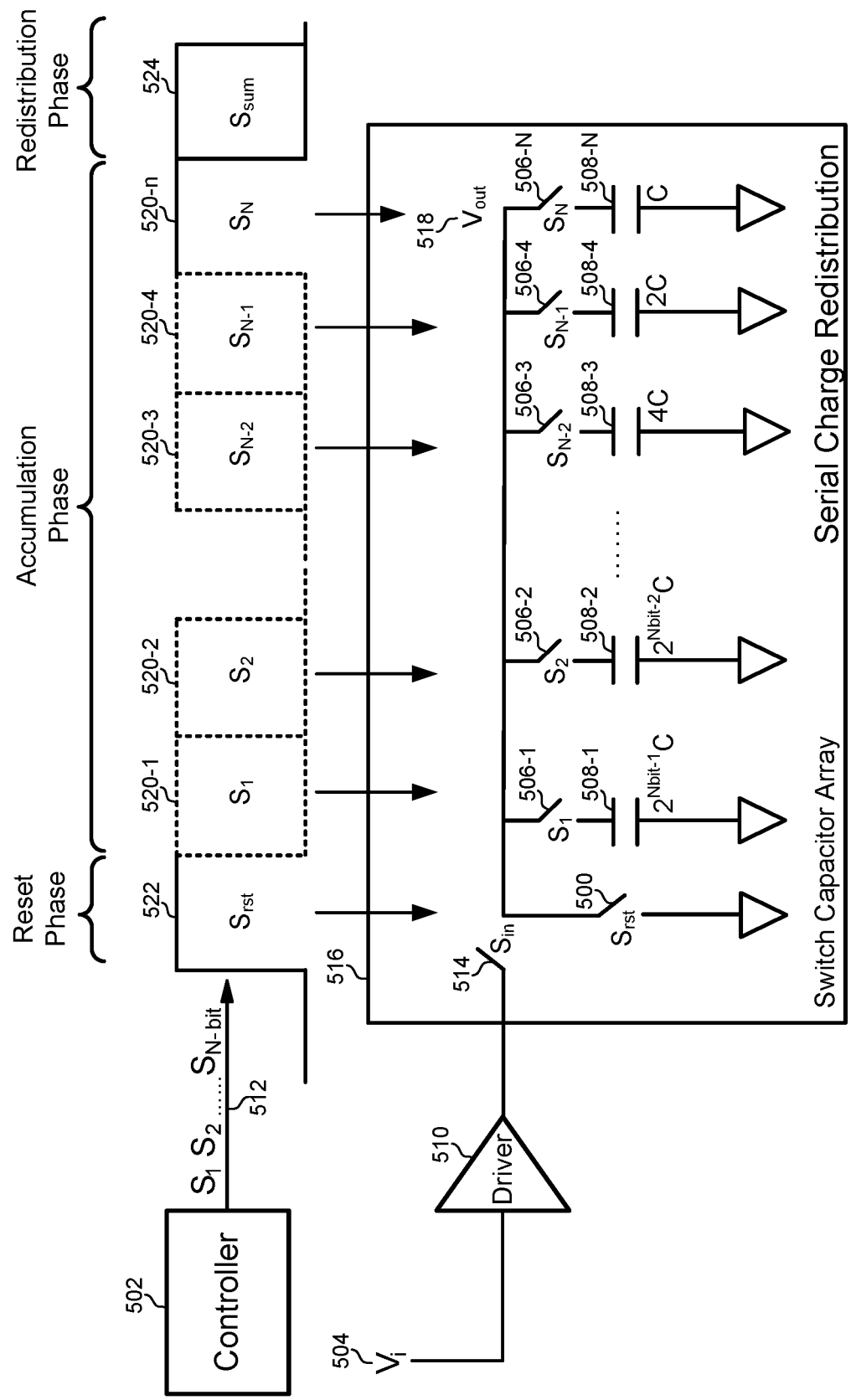
FIG. 5 illustrates an example circuit for a switch capacitor array used to perform serial charge redistribution, according to some embodiments.

FIG. 5 illustrates a sequential bit-order summation circuit used to perform serial charge redistribution, according to some embodiments. The switch capacitor array 516 may be used to implement the summation circuit for the outputs of the vector-matrix multiplication operation described above. As described above, the circuit may include a driver 510 that receives an input for receiving sequences individual bit-order results from a bit-order operation, such as a vector-matrix multiplication operation. Note that this circuit may be used with any bit-order operation. The vector-matrix multiplication operation described above is provided only by way of example, and is not meant to be limiting. Any operation that generates individual, sequential results based on bit-order to be converted into a single analog output may use this circuit to perform the summation operation and generate a final output.

The input 504 may be an analog current received from the output of the bit-order operation. The driver 510 may convert the analog current into a corresponding voltage signal. Alternatively, the input 504 may be an analog voltage that is boosted or scaled by the driver 510. The output of the driver 510 may be provided to an input switch 514. The input switch 514 may be opened during a reset operation described below. After passing through the input switch 514, the signal from the driver 510 (e.g., an analog voltage) may enter one of the legs of the switch capacitor array 516.

As described above, the switch capacitor array 516 may include a plurality of switches 506 that are coupled to a corresponding plurality of capacitors. Each switch-capacitor pair may be arranged in series with each other as depicted in FIG. 5. The plurality of switch-capacitor pairs may then be arranged in parallel with each other. The plurality of switches 506 may be operated by a controller 502. The controller 502 may generate individual signals that individually operate the plurality of switches 506. For example, the switches 506 may be implemented using transistors, and the controller 502 may provide voltages to the gates of those transistors to control whether the transistors are conducting or non-conducting. The switches 506 may also be implemented using relays, triacs, or other switching circuit elements, and the controller 502 may provide voltages/currents that cause those switches to open or close. The controller 502 may be implemented by a processor/microprocessor or microcontroller that controls the timing of the switches 506 and/or other timing signals for the multiplier-accumulator operations described above. The microprocessor or microcontroller may execute instructions stored on an instruction memory or memory device that cause the microprocessor or microcontroller to perform operations to generate the timing signals. Alternatively, the controller 502 may be implemented by a state machine circuit, such as a field-programmable gate array (FPGA) or other programmable logic circuit that generates timing outputs for the switches 506. In some embodiments, the controller 502 may be implemented by a computer system that generates digital outputs through a parallel or serial communication port.

As described above, the capacitors 508 may be implemented using circuit elements that have a capacitance that doubles with each corresponding bit-order. As illustrated in FIG. 5, a bit-order operation result corresponding to a least-significant bit may be stored on a capacitor 508-N with a capacitance of "C." A next-least-significant bit result may be stored on a capacitor 508-4 with a capacitance of "2C", and so forth. The switches 506 may be operated individually and sequentially to store the values of the corresponding bit-order results on the corresponding capacitors 508. The size of the capacitance on each of the capacitors 508 may affect the settling time, which may be defined as the time required to store the value from the driver 510 on the corresponding capacitor. Note that the capacitors in FIG. 5 are provided only by way of example and are not meant to be limiting. The capacitors may be replaced with any energy storage element, including various types of capacitors, super capacitors, and so forth.

As each of the analog vector matrix multiplier operations are performed sequentially on each bit-order, an output may be provided from the weighting matrix. For each bit-order, the switches 506 may be operated to store a value corresponding to the output of the multiplier operation on a corresponding capacitor. For example, to store a value for the LSB, switch 506-N may be closed, while the remaining switches in the plurality of switches 506 may remain open. The input switch 514 may be closed, and the reset switch 500 may remain open. Operating the switch paired with the bit-order capacitor may include closing the switch for a defined time interval and opening the switch at the end of the time interval. In some embodiments, the input switch 514 may be operated with a slight delay from the switch 506-N for the capacitor. For example, switch 506-N may be closed, then the input switch 514 may be closed at the beginning of the time interval. At the end of the time interval, the input switch 514 may be opened, and then switch 506-N may be opened.

Time intervals 520, 522, 524 may be associated with each of the switches in FIG. 5. A reset time interval 522 may begin when the reset switch 500 and the plurality of switches 506 are closed to allow the values stored on the capacitors 508 to be discharged through the ground connection of the reset switch 500, which effectively clear the values stored on the capacitors. A summation time interval 524 may begin when the reset switch 500 and the input switch 514 are opened and the plurality of switches 506 are closed to allow charge to be redistributed across the capacitors 508. The summation time interval 524 may also include measuring a voltage 518 across the plurality of capacitors 508, as they may be arranged in parallel as depicted in FIG. 5. This voltage 518 may represent the output of the bit-order operation (e.g., the MAC result). The multiple accumulation phase time intervals 520 where values are transferred from the multiplication matrix to the capacitors 508 may begin when each bit-order switch in the plurality of switches 506 is closed along with the input switch 514. Each of the accumulation phase time intervals 520 may end when the switches are opened. The accumulation time intervals may also be referred to as storage time intervals.

In some implementations, each of these time intervals 520, 522, 524 may be uniform. In other implementations, the reset interval 522 and/or the summation time interval 524 may be different from the accumulation phase time intervals 520, and each of the accumulation phase time intervals 520 may be of uniform length.

Figure 6:
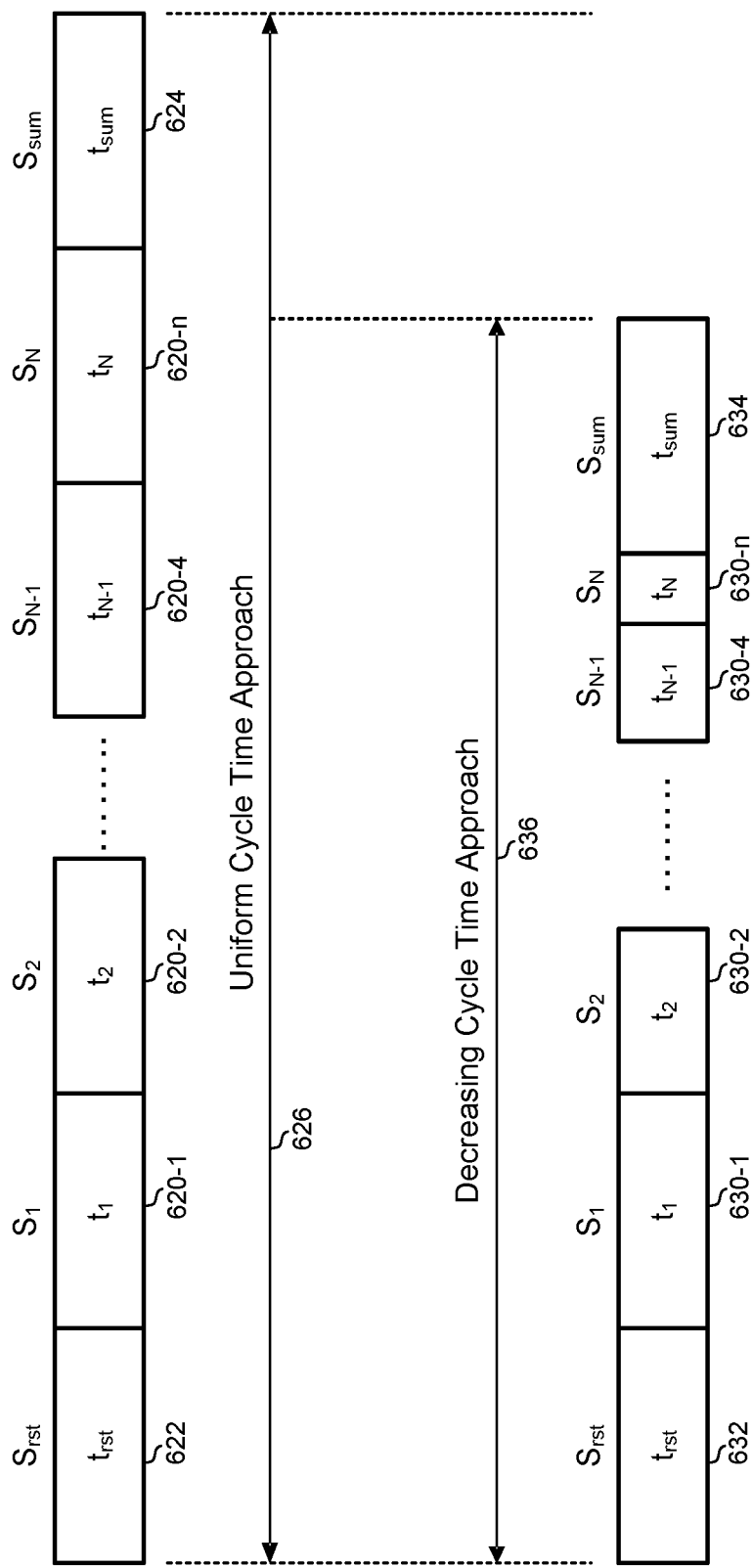
FIG. 6 illustrates a timing diagram using non-uniform time intervals, according to some embodiments.

FIG. 6 illustrates a timing diagram using non-uniform time intervals, according to some embodiments. Although using uniform time intervals may simplify the design of the controller 502, uniform time intervals may lead to an unnecessarily long total cycle time 626 for each MAC operation. However, because capacitors of different sizes are used in the switch capacitor array, the settling time for each of these capacitors may be different. The speed with which the driver can charge any connected capacitors may depend on a load attached to the driver (e.g., the total capacitance charged by the driver in the switch capacitor array). One method of controlling the timing of the switches is to determine the longest settling time for any of the individual capacitors, and then controlling the switches based on that time. This ensures that the charge on any of the capacitors settles properly before the switches are opened such that an accurate result may be stored on the capacitors. Opening switches too soon may cause the charge stored on the capacitors to not precisely represent the voltage provided by the driver.

However, some embodiments described herein may use adaptive timing for the switch controls in the switch capacitor array. Using a uniform cycle time may not be the most efficient solution, especially when the most-significant bit (MSB) capacitor value is very large in comparison to the least-significant bit (LSB) capacitor. FIG. 6 illustrates the accumulation time intervals 620 that may be used under a uniform cycle time approach, resulting in a total cycle time 626.

In this example, a reset time interval 622 and a summation time interval 624 may be a same uniform length as the accumulation time interval 620. In other embodiments, they may be different than the accumulation time interval 620. FIG. 6 also illustrates a non-uniform cycle time used for accumulation time intervals 630 using an adaptive approach. The accumulation time interval 630 may be non-uniform in length with respect to each other, and may be non-uniform in length with respect to the reset time interval 632 and/or the summation time interval 634. In some embodiments, the length of the accumulation time interval 630 may be based at least in part on a settling time of each corresponding capacitor. Smaller capacitors associated with the lower-significance bits in the bit-order operation may use a smaller settling time, while larger capacitors associated with the higher-significance bits in the bit-order operation may use a longer settling time. As illustrated in FIG. 6, the controller may operate the switches corresponding to these capacitors based on this settling time. For example, the accumulation time interval 630-1 for an MSB may be larger than an accumulation time interval 630-2 for the next most-significant bit, and so forth. In similar fashion, the reset time interval 632 and/or the summation time interval 634 may also have a non-uniform length with respect to other time intervals illustrated in FIG. 6. These time intervals 632, 634 may be based at least in part on a time used to fully reset the values on the capacitors, and/or a time after which charge has been fully redistributed on the capacitors during the summation phase.

The non-uniform lengths of these time intervals may be programmed into the controller. These time intervals may be measured directly in a laboratory or experimental environment to determine settling times that are needed for the sizes of capacitors that are used in the switch capacitor array. The settling times may also be calculated using the known time constants of the total load, or they may be simulated using circuit simulation software.

In some embodiments, the non-uniform lengths of these time intervals may be dynamically adjusted by the controller during operation. For example, the switch-capacitor array may include a voltage measurement circuit (e.g., a voltage divider coupled to an analog-to-digital converter) that feeds back into the controller. The controller may dynamically measure the settling time for each capacitor during actual MAC operations. Because the time constants associated with each bit-order may change over time, may change with temperature, and/or may be affected by other environment conditions, the time intervals 630 may be dynamically adjusted such that they may be as short as possible to minimize the overall cycle time 636.

In some embodiments, the controller may use different modes of operation that increase and/or decrease the accumulation cycle times 630. For example, the controller may use a first mode of operation that emphasizes the accuracy of the result. This first mode of operation may add time to each of the accumulation time intervals 630 or increase the length of the time intervals 630 by a percentage amount to ensure that the value has been stored as accurately as possible. This may represent a trade-off between greater accuracy with longer cycle times. In contrast, a second mode of operation may reduce the lengths of one or more of the time intervals 630 by an amount or a percentage in order to decrease the overall cycle time 636 at the expense of accuracy. Multiple modes of operation may be added in each direction, providing multiple levels of speed increase/decrease, along with multiple levels of accuracy increase/decrease.

Figure 7:
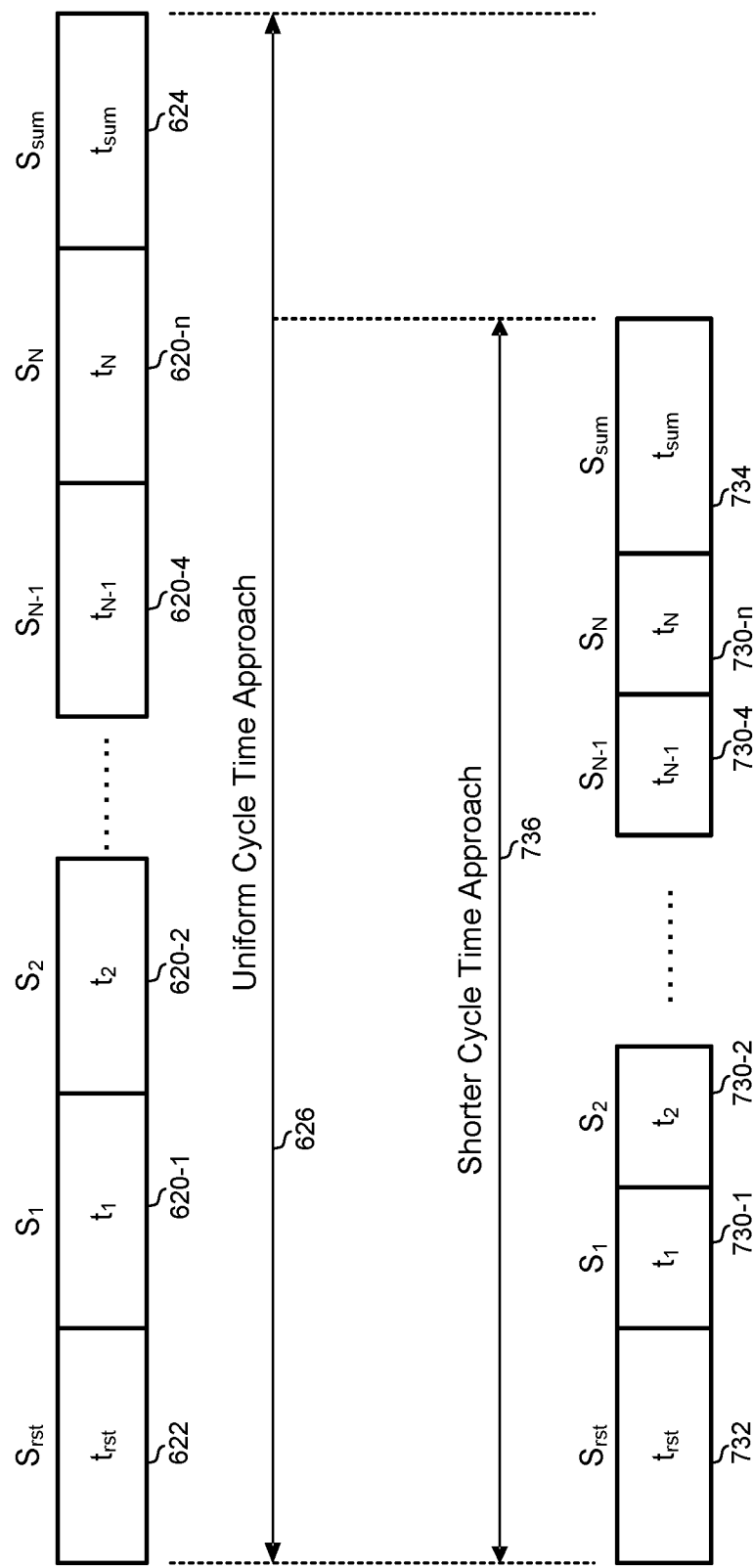
FIG. 7 illustrates a simplified shorter cycle time approach, according to some embodiments.

FIG. 7 illustrates a simplified shorter cycle time approach, according to some embodiments. This approach uses uniform accumulation time intervals 730 that are shorter than the reset time interval 732 and/or the summation time interval 734. This allows the control of the accumulation time intervals 730 to be simplified while still allowing the accumulation time intervals 730 to be shorter than the reset time interval 732 and/or the summation time interval 734. Generally, the reset time interval 632 and/or the summation time interval 634 may be longer than is used for the accumulation time in both 730. Even uniformly reducing the accumulation time intervals 730 may result in an overall cycle time 736 that is still shorter than the total cycle times 626 of the uniform cycle time approach. The length of the accumulation time intervals 730 may be set to the largest settling time in the switch capacitor array (e.g., the settling time for the capacitor associated with the MSB).

Figure 8:
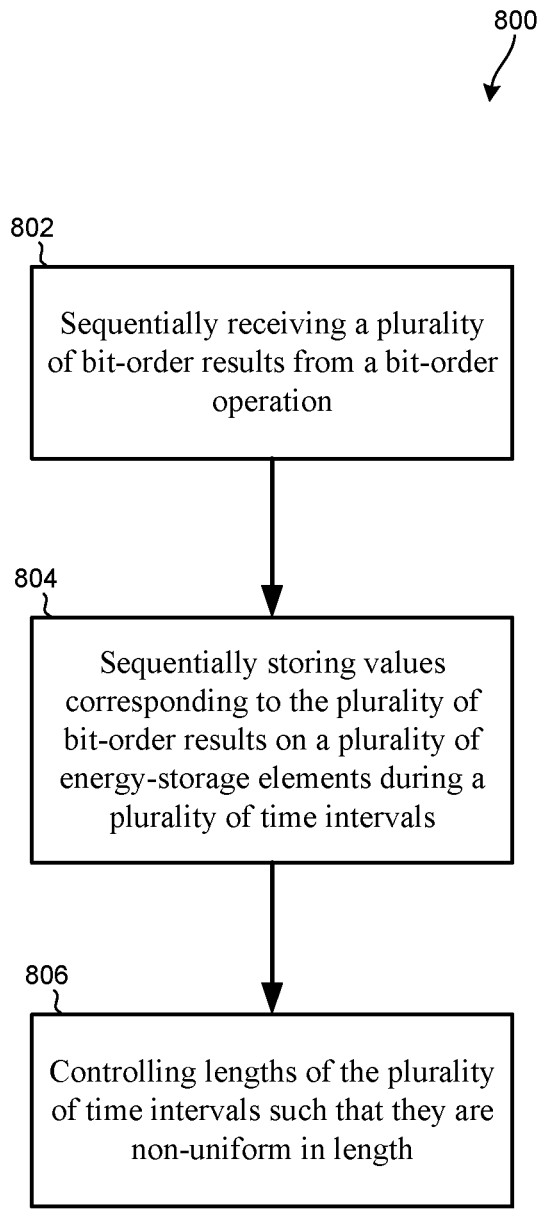
FIG. 8 illustrates a flowchart of a method of storing and aggregating sequential, bit-order results, according to some embodiments.

FIG. 8 illustrates a flowchart of a method of storing and aggregating sequential, bit-order results, according to some embodiments. The method may include sequentially receiving a plurality of bit-order results from a bit-order operation (802). As described above, the bit order operation may include the bit-order multiplication procedure described above, including converting a digital input vector of binary-encoded values into analog signals using one-bit DACs. The analog vector matrix multiplier may sequentially perform a vector-matrix multiplication operation that uses a weighting matrix for each bit-order analog input signal as illustrated in FIGS. 1-2. These inputs may be received as an analog voltage or current, and may pass through a driver that outputs a boosted/scaled voltage for the switch capacitor array.

The method may also include sequentially storing values corresponding to the plurality of bit-order results on a plurality of energy-storage elements during a plurality of time intervals (804). As illustrated and described above in FIG. 5, these values may be stored on the capacitors by operating a plurality of corresponding switches. The switches and capacitors may be arranged in pairs in parallel legs of a switch capacitor array. A controller may generate output signals that operate the switches, causing them to allow values to be stored on the capacitors during defined time intervals as described above in FIG. 5.

The method may further include controlling lengths of the plurality of time intervals such that they are non-uniform in length (806). The non-uniformity of the lengths of the time intervals may be measured relative to each other. For example, the time intervals may be based at least in part on a measured, estimated, simulated, or known settling time for each of the corresponding capacitors. Time intervals for smaller capacitors may be smaller than the time intervals for larger capacitors. These time intervals may also be dynamically controlled during operation by measuring the settling time on each of the capacitors during operation to compensate for drift, temperature variation, process variations, aging, and other characteristics that may affect the consistency of the settling time between operations. These time intervals may be controlled as described above in FIGS. 5-7.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered

What is claimed is:

1. A method for performing bit-order summations, the method comprising:
   sequentially receiving a plurality of partial sums corresponding to bit orders of a vector operation;
   for each sequentially received partial sum, operating a switch in a plurality of switches that corresponds to a current bit-order, wherein:
      operating the switch causes a value corresponding to a partial sum of the current bit-order to be stored on a capacitor in a plurality of capacitors, and the capacitor corresponds to the current bit-order; and
      a time interval during the switch is operated is non-uniform with respect to time intervals during which other switches in the plurality of switches are operated, and the time interval is based at least in part on a settling time of the capacitor; and
   performing a bit-order weighted summation of values stored on the plurality of capacitors to generate a result of the vector operation.

2. The method of claim 1, further comprising operating a reset switch that clears values stored on the plurality of capacitors after generating the result of the vector operation.

3. The method of claim 1, wherein the partial sums comprise analog currents.

4. The method of claim 3, further comprising, for each partial sum, converting the analog current into an analog voltage through a driver circuit, and storing the analog voltage on the capacitor.

5. The method of claim 1, wherein performing the bit-order weighted summation comprises:
   operating the plurality of switches to redistribute charge stored on the plurality of capacitors; and
   measuring a voltage across the plurality of capacitors, wherein the plurality of capacitors are arranged in parallel.

6. The method of claim 1, further comprising:
   measuring the settling time for the capacitor during operation; and
   dynamically adjusting the time interval based on the settling time after measuring.

7. The method of claim 1, wherein the plurality of capacitors have capacitance values that double with each bit-order.

8. The method of claim 1, wherein the time intervals decrease in length from a most-significant bit (MSB) to a least-significant bit (LSB).

9. The method of claim 1, wherein the lengths of the time intervals are controlled by sequentially closing switches in the plurality of switches corresponding to bit-order.

10. The method of claim 1, wherein the time intervals comprise a reset time interval during which the values stored on the plurality of capacitors are cleared.

11. The method of claim 10, wherein the time intervals further comprise a summation time interval during which the values stored on the plurality of capacitors are redistributed.

12. The method of claim 11, wherein:
the time intervals further comprise storage time intervals during which the values corresponding to the partial sums are stored on the plurality of capacitors; and
the storage time intervals have uniform lengths that are shorter than the summation time interval or the reset time interval.

13. The method of claim 11, wherein:
the time intervals further comprises storage time intervals during which the values corresponding to the partial sums are stored on the plurality of capacitors; and
the storage time intervals have non-uniform lengths that are different from the summation time interval and the reset time interval.

* * * * *